(12) United States Patent
Boscolo Berto

(10) Patent No.: US 10,848,083 B2
(45) Date of Patent: Nov. 24, 2020

(54) METHOD OF DETECTING THE POSITION OF AN ELECTRIC MOTOR, CORRESPONDING SYSTEM AND MOTOR

(71) Applicant: STMicroelectronics S.r.l., Agrate Brianza (IT)

(72) Inventor: Michele Boscolo Berto, Sesto San Giovanni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 1 day.

(21) Appl. No.: 16/202,939

(22) Filed: Nov. 28, 2018

(65) Prior Publication Data

US 2019/0181784 A1 Jun. 13, 2019

(30) Foreign Application Priority Data

Dec. 12, 2017 (IT) .......... 102017000142791

(51) Int. Cl.
*H02P 6/185* (2016.01)
*H02P 6/20* (2016.01)
*G01R 31/34* (2020.01)
*H02P 27/04* (2016.01)

(52) U.S. Cl.
CPC .......... *H02P 6/185* (2013.01); *G01R 31/346* (2013.01); *H02P 6/20* (2013.01); *H02P 27/04* (2013.01)

(58) Field of Classification Search
CPC .......... H02P 6/185; H02P 6/20; G01R 31/346
See application file for complete search history.

(56) References Cited

U.S. PATENT DOCUMENTS

| 5,028,852 A | 7/1991 | Dunfield |
| 8,704,479 B2 | 4/2014 | Bonvin et al. |
| 2011/0109255 A1* | 5/2011 | Bonvin .......... H02P 6/185 318/400.33 |
| 2017/0170758 A1* | 6/2017 | Bateman .......... H02P 6/20 |
| 2017/0170767 A1* | 6/2017 | Yoshiya .......... H02P 6/20 |

OTHER PUBLICATIONS

Search Report and Written Opinon for IT 201700142791, dated Aug. 9, 2018.

* cited by examiner

*Primary Examiner* — Bickey Dhakal
*Assistant Examiner* — Bradley R Brown
(74) *Attorney, Agent, or Firm* — Slater Matsil, LLP

(57) ABSTRACT

In an embodiment, a method for detecting the angular position of the rotor of an electric motor includes an inductive-sense procedure implemented by applying to the windings of the electric motor a time sequence of position-detection pulse signals, detecting a corresponding time sequence of response signals, integrating the response signals, and recording respective times taken by the response signals to reach an integral reference threshold. The position of the rotor is detected as a function of the respective times. The integral reference threshold is established by fixing a peak value, applying to the windings a calibration pulse, detecting the corresponding response signal and determining the time taken to reach the peak value. The integral reference threshold is selected as the integral of the response signal.

20 Claims, 8 Drawing Sheets

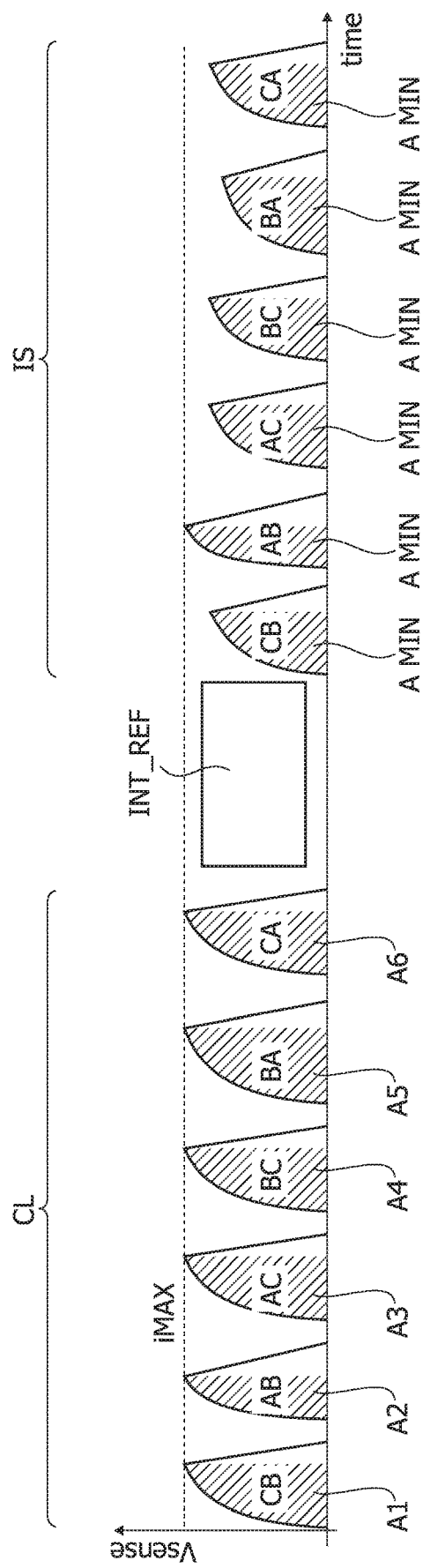

METHOD OF DETECTING THE POSITION OF AN ELECTRIC MOTOR, CORRESPONDING SYSTEM AND MOTOR

CROSS-REFERENCE TO RELATED APPLICATIONS

This application claims priority to Italian Patent Application No. 102017000142791, filed on Dec. 12, 2017, which application is hereby incorporated herein by reference.

TECHNICAL FIELD

The present invention relates generally to an electronic system and method, and, in particular embodiments, to a method of detecting the position of an electric motor, corresponding system and motor.

BACKGROUND

In the art, numerous methods have been developed for detecting the position of an electric motor, such as a brushless DC motor (BLDC). For example, the angular position of a BLDC motor may be determined in sensor-less mode, i.e., without envisaging the presence of specific sensors. BLDC motors may be used, for example, as spindle motors in hard disk units and readers for compact disks, DVDs, etc.

Various solutions may be based upon the variation of the L/R time constant of the windings of the motor as a function of the position of the rotor. These methods, which go under the current term "inductive sense" are based upon application of current pulses to the windings (phases) of the motor, the characteristic of which varies as a function of the position of the rotor due to saturation effects generated by the permanent magnet of the rotor.

By analyzing the characteristic of the various pulses, it is possible to estimate the position of the rotor.

Documents such as U.S. Pat. Nos. 5,028,852 and 8,704,479 are provided by way of example of the prior art.

SUMMARY

Even though there has been extensive activity in the sector, there is still a need to provide solutions that further improve from various standpoints linked to the accuracy of the sensing action and to the absorption of power/energy linked to execution of the sensing action.

One or more embodiments improve the accuracy of the sensing action and/or absorption of power/energy linked to execution of the sensing action.

One or more embodiments may be applied to electric motors, such as brushless motors used (e.g., BLDC), for example, in hard disks and readers for compact disks, DVDs, etc.

One or more embodiments may regard a corresponding system.

One or more embodiments may regard a corresponding electric motor.

One or more embodiments may enable one or more of the following advantages to be achieved:

optimization of the determination of the (integral) reference used for the procedures of detection of the inductive-sense type;

possibility of conducting the aforesaid action of optimization via a current-peak control implemented simultaneously with detection, with the possibility of using an integrated value measured during a first pulse as reference value for the rest of an inductive-sense procedure;

possibility of generating a number of calibration current pulses using a current-peak control, measuring the integral value of the current of each pulse with the possibility of using the lowest integral value measured for the various pulses generated as reference value for the rest of the inductive-sense procedure.

BRIEF DESCRIPTION OF THE DRAWINGS

One or more embodiments will now be described, purely by way of non-limiting example, with reference to annexed drawings, wherein:

FIG. 10 provides by way of example possible plots of currents in the context of an inductive-sense procedure based upon embodiments.

DETAILED DESCRIPTION OF ILLUSTRATIVE EMBODIMENTS

Figure 1:
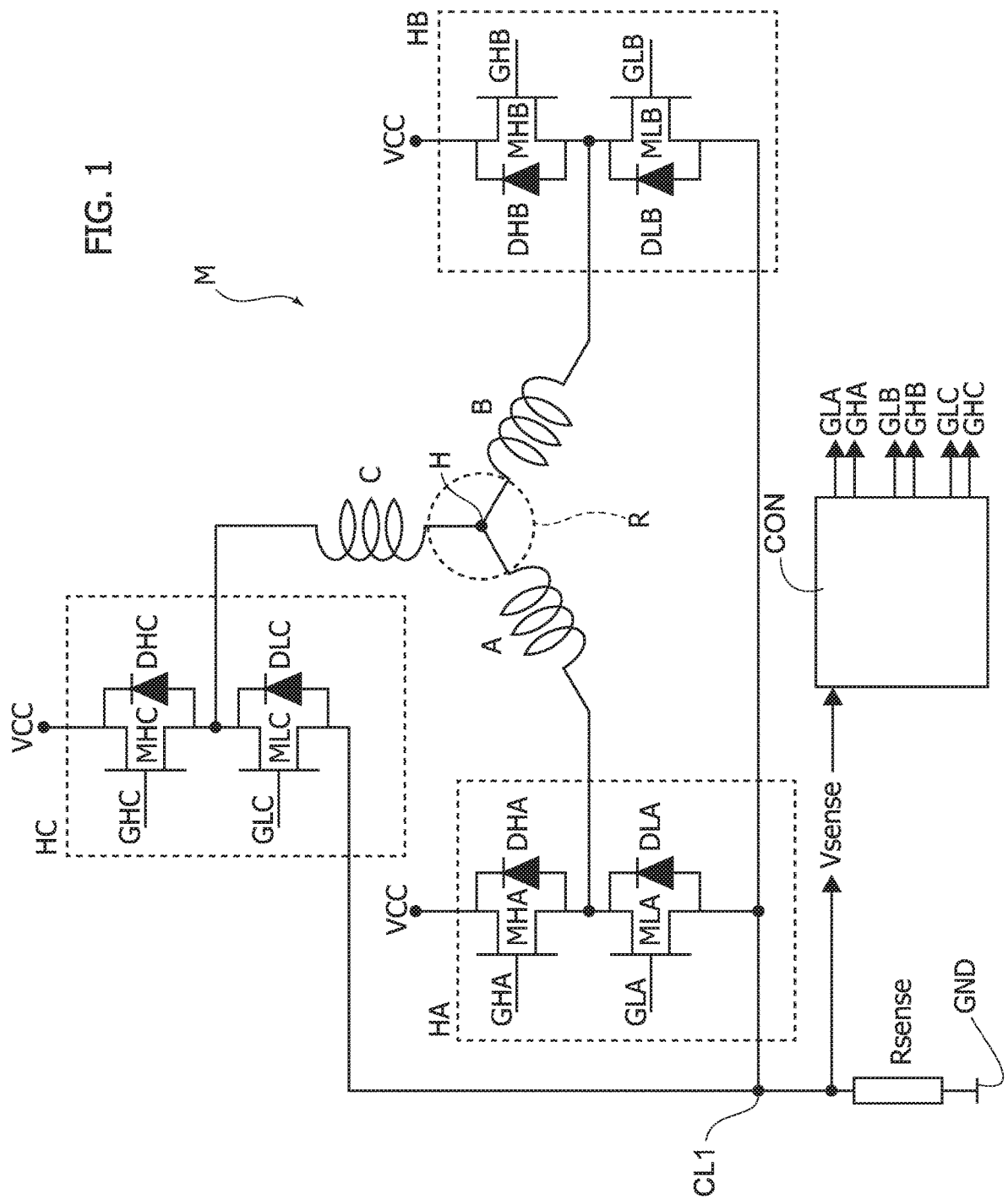
FIG. 1 illustrates a possible context of use of embodiments.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments.

The references used herein are provided merely for convenience and hence do not define the sphere of protection or the scope of the embodiments.

The information on the position (e.g., the angular position of the rotor) of an electric motor with the motor not turning constitutes an important parameter for the purposes of correct execution of a procedure of start-up of an electric motor such as a BLDC motor.

It is desirable that the driving sequence of the rotor windings can be synchronized with the position of the rotor, which should advantageously be known in a precise and reliable way.

As already discussed, certain techniques used for measuring the (angular) position of the rotor of a motor (which are frequently referred to as "inductive-sense techniques") are based upon a different response to the pulses applied to the windings of the motor. The different response depends upon the level of saturation of the windings, which, since it is a function of the position of the rotor, enables identification of the position of the rotor itself.

Considering, for example, a three-phase motor (i.e., with three windings or "phases" denoted by A, B, C) an inductive-sense procedure may be implemented by applying voltage pulses in the six configurations CB, AB, AC, BC, BA, and CA, where the first letter indicates the phase connected to the higher potential, while the second letter indicates the phase connected to the lower potential. The procedure then envisages analysis of the response in current of the system, which is available thanks to the use of a sensing element (for example, a resistor). The response in current, since it is a function of the position of the rotor as a result of the saturation that the rotor is able to generate on the windings themselves, provides information on the position of the rotor.

In U.S. Pat. No. 5,028,852, a solution is described in which the windings of the motor are excited in the six possible configurations (in the case of a three-phase motor) until a current threshold is reached, and the estimate of the position is obtained starting from the time required for the aforesaid threshold to be reached. In this case, the current pulse that first reaches the aforesaid current threshold is the one corresponding to the phase with the shortest time constant and hence with highest saturation, which corresponds to a precise position of the rotor.

U.S. Pat. No. 8,704,479 (assigned to the present assignee) describes a system and a method for determining the initial position of a motor, where voltage pulses applied across windings of a motor generate a current-response signal, the characteristics of which are a function of the position of the motor.

More specifically, U.S. Pat. No. 8,704,479 describes a solution based upon integration of the current value during generation of the pulses and upon the use, as threshold value, of an integral value instead of a current-peak value. In other words, the time taken to reach the value of integration of the current is used for estimating the position of the rotor.

In a solution like the one described in U.S. Pat. No. 8,704,479, the various current pulses do not have the same peak value as may occur, for example, in solutions based upon detection of the time necessary to reach a peak value (where the peak is by definition the controlled variable).

In a solution as described in U.S. Pat. No. 8,704,479, the various current pulses may present different peak values, which are a function of the time constant of the motor, and are hence with a higher value for the pulse applied to the phase with a shorter time constant.

In a solution as described in U.S. Pat. No. 8,704,479, the greater the difference between the time constants of the various windings, the greater the difference of the current peaks given the same area (integral) of the pulse.

In the presence of limitations at the maximum current level, it may be expedient to select the threshold (integral value) in such a way that the current peak of higher value does not exceed a maximum value tolerated for the application.

It has, however, been noted that the time constant of the load constituted by the windings of the motor may vary appreciably as a function of temperature. If it is then taken into account that the time to reach a certain threshold of the integral value may be affected by the supply voltage, there emerges a certain difficulty in estimating the optimal threshold value to be used in the procedure based upon the integral value of the current pulses when it is desired to facilitate maximization of the current, at the same time preventing a tolerated maximum value from being exceeded.

To deal with a situation of this kind, it is possible to consider envisaging margins defined taking into account the worst-case conditions.

This solution is, however, limiting if the possible large variation, for example as a function of temperature, of the resistance of the windings of the motor (a variation that results in corresponding variations of the time constant) and the possible variations of the supply voltage (which may amount to as much as ±10%, for example) are considered.

The endeavor not to exceed a given current-peak value in worst-case conditions, hence, may end up penalizing the performance of the system in the situations of nominal operation.

One or more embodiments as exemplified herein envisage a calibration procedure that is able to return an integral value that may be used as reference threshold value in an inductive-sense procedure, while maintaining the use of the highest value of current peak equal, for example, to the highest current value tolerated according to the needs of application and use, for example as a function of optimization of performance.

In FIG. 1, the reference M designates as a whole an electric motor (for example, of the three-phase BLDC sensor-less type), of which the rotor R, three windings or phases A, B, C, and the power stage for driving it are represented.

In the example presented, the above power stage comprises three half-bridge circuits HA, HB, and HC. The half-bridge circuits are coupled to a supply line VCC and each comprise two electronic switches (for example, power MOSFETs) distributed in low-side switches MLA, MLB, and MLC and high-side switches MHA, MHB, and MHC.

Associated to each switch is a diode, as shown in FIG. 1. Two diodes DLA and DHA (low-side and high-side, respectively) are associated to the low-side and high-side switches of the half-bridge HA. Two diodes DLB and DHB (low-side and high-side, respectively) are associated to the low-side and high-side switches of the half-bridge HB. Two diodes DLC and DHC (low-side and high-side, respectively) are associated to the low-side and high-side switches of the half-bridge HC.

In the representation of FIG. 1, the three windings/phases A, B, C are represented coupled together according to a star configuration, hence with a common central node H and with each winding/phase coupled to one of the half-bridges HA, HB, and HC, respectively, at the intermediate node between the low-side and high-side transistors.

The three half-bridges HA, HB, HC may then be coupled (at the opposite end with respect to the supply node/line VCC) to a common sensing line/node CL1, connected to which is a resistor Rsense set between the common line/node CL1 and ground GND.

Across the resistor Rsense a sensing (voltage) signal Vsense is hence available, which indicates the intensity of the current that flows through the windings A, B, and C and which may be used according to the modalities discussed in what follows.

In one or more embodiments, the sensing function exemplified herein by the resistor Rsense may be implemented in various ways, for example via circuits, referred to as "senseFETs," integrated within the MOSFETs or else via a senseFET (ISOFET) integrated in a decoupling element set in series with the supply of the high-side sections.

Whatever the way in which the sensing signal Vsense has been generated, it can be supplied to a control circuit CON, which may perform (according to known criteria) the action of control of the motor M as a function of the signal Vsense, in particular as a function of the position of the motor M driven via the windings/phases A, B, and C.

The general circuit architecture exemplified in FIG. 1 (or equivalent circuit configurations) are to be deemed known in the art, which renders it any more detailed description thereof superfluous.

Figure 2:
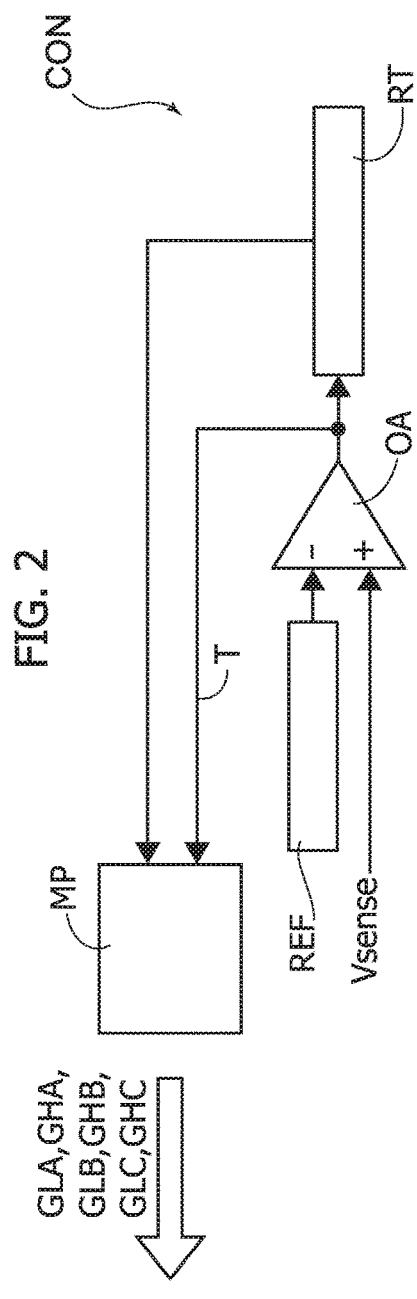
FIG. 2 exemplifies possible criteria of execution of an inductive-sense procedure in a context of use as exemplified in FIG. 1.

FIG. 2 exemplifies a diagram of a control circuit CON in which the sensing signal Vsense is compared in a comparator OA with a reference level, measuring the time taken by the signal Vsense to reach a peak value supplied by a reference circuit block REF. The time thus detected, recorded in a circuit block RT, may be supplied, together with a synchronization trigger signal on a line T to a circuit (for example, a microprocessor MP), which is able to identify, on the basis of the signals received, the (angular) position of the rotor R of the motor M and to drive the half-bridges HA, HB, HC accordingly (FIG. 1) by applying, according to known criteria, corresponding driving signals to the driving terminals GLA, GHA, GLB, GHB, GLC, GHC (gates, in the case of MOSFETs) of the various electronic switches comprised in the half-bridges.

In some embodiments, the reference circuit block REF is controlled by microprocessor MP.

Figure 3:
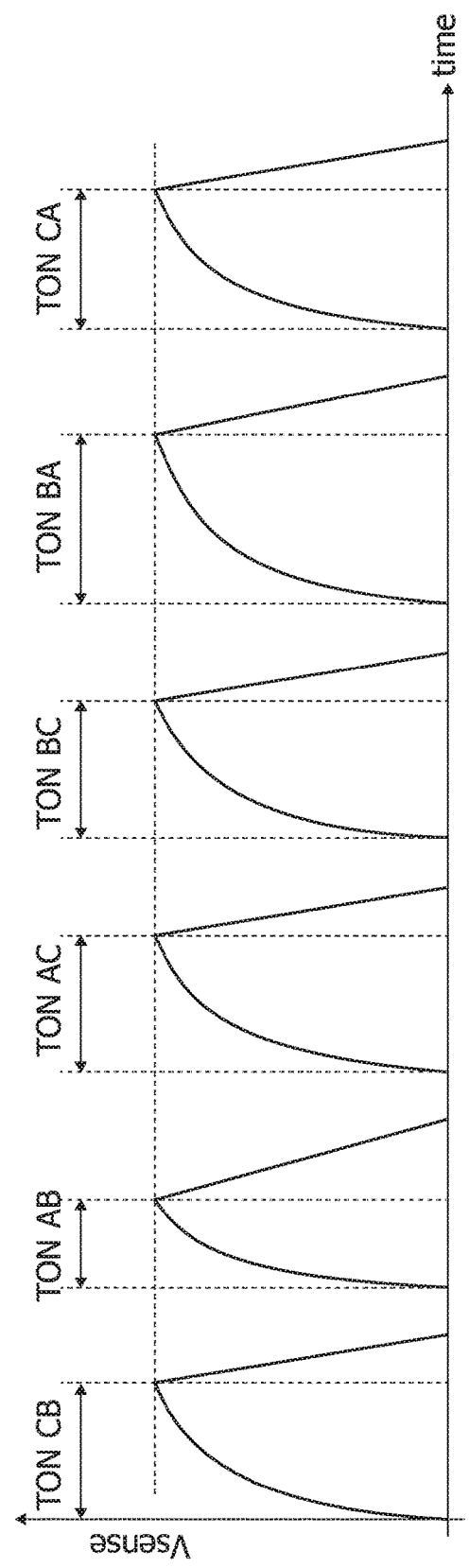
FIG. 3 represents a possible plot of waveforms of a procedure as exemplified in FIG. 2.

FIG. 3 is a time plot provided by way of example of a possible plot of the signal Vsense as this may be detected in an inductive-sense procedure based upon the control of the current-peak value, i.e., by preventing the signal Vsense from exceeding a reference value (which is the same for all the excitation pulses) with the above pulses that differ from one another only as regards their duration, for example, the time interval (TON CB, TON AB, TON AC, TON BC, TON BA, TON CA) taken to reach the reference value. This duration is a function of the time constant of the individual phase/winding, hence of the angular position of the motor M.

The above solution (substantially corresponding to the solution described in U.S. Pat. No. 5,028,852) is hence based upon the measurement of the time taken to reach a current-peak value, guaranteeing, so to speak "by definition," a control on the highest peak value of the current.

It has been noted that this solution is affected by a certain sensitivity to disturbance such as to jeopardize the precision of the estimation of the position of the rotor.

Figure 4:
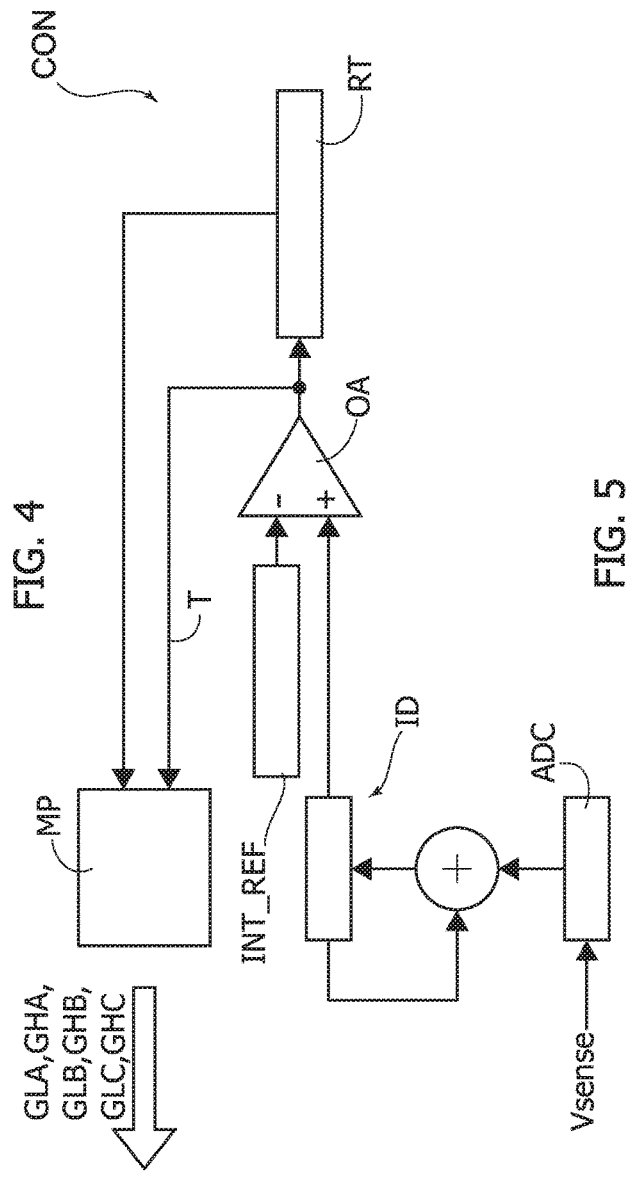
FIG. 4 exemplifies possible criteria of execution of an inductive-sense procedure in a context of use as exemplified in FIG. 1.
Figure 5:
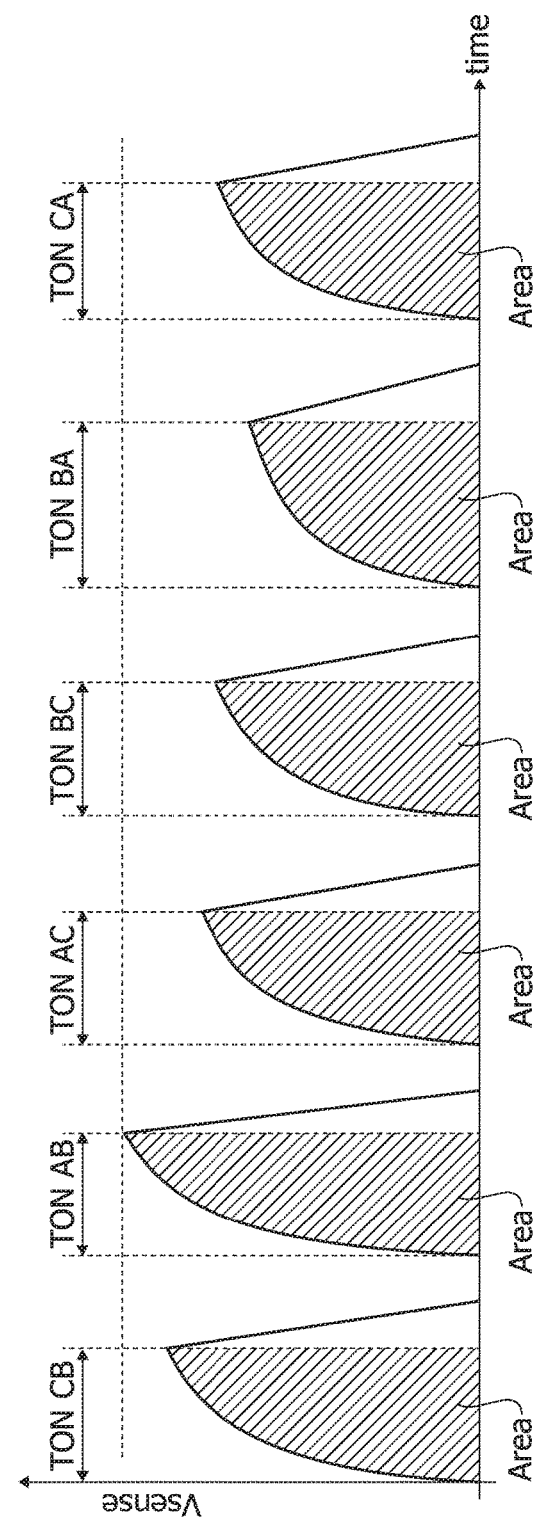
FIG. 5 illustrates a possible plot of waveforms of a procedure as exemplified in FIG. 4.

FIGS. 4 and 5 refer to a solution substantially corresponding to the one exemplified in U.S. Pat. No. 8,704,479. This solution uses as reference, not the peak value, but the integral value of the current, as expressed by Vsense (even though in itself Vsense is a voltage signal, detected, for example, across Rsense in FIG. 1, it is an "amperometric" signal representing the intensity of the current that flows through the windings/phases A, B, and C).

The solution of FIGS. 4 and 5 envisages integration of the various current pulses and measurement of the time taken by the various integrated current pulses to reach a certain integral value (hatched area in the diagrams of FIG. 5), where the aforesaid quantity is used for establishing the position of the rotor of the motor M.

This solution presents improved characteristics in terms of rejection to disturbance and is hence suited for applications in which the current-sensing element is exposed to electrical noise.

FIG. 4 (where parts or elements similar to parts or elements already described with reference to FIG. 2 are designated by the same references, it not being necessary to repeat the description thereof) envisages that the signal Vsense is subjected to an analog-to-digital conversion in a circuit block denoted by ADC, and is then subjected to an integrate-and-dump operation in a circuit block ID so as to be able to supply a trigger signal T when the result of the integrate-and-dump operation reaches a reference value which, being an integral reference, is here designated by INT_REF.

The time detected, recorded in the block RT, hence represents the time to reach the reference threshold, which, also in this case, is a function of the time constant of the load and hence a function of the (angular) position of the rotor.

Also in this case, the above time may be used by the circuit MP for driving the motor M via the half-bridges HA, HB, HC, for example, via corresponding driving signals at the driving terminals GLA, GHA, GLB, GHB, GLC, GHC (gates, in the case of MOSFETs) of the various electronic switches comprised in the half-bridges.

The diagram of FIG. 5 exemplifies a possible plot of the signal Vsense during an inductive-sense procedure of the type just described, based upon control of the integral value (area) of the current.

In this case, the pulses TON CB, TON AB, TON AC, TON BC, TON BA, TON CA have one and the same integral value in the rising part (hatched area subtended thereby). Also in this case, the time to reach the (integral) threshold is a function of the angular position of the rotor; in this case, the various pulses of the signal Vsense present different peak values in so far as the peak value of the single pulse depends upon the time constant of the load.

A solution as exemplified in FIGS. 4 and 5 hence determines a variability of the peak of the current detected through the signal Vsense as a function of the characteristics of the load, likewise possibly depending upon other parameters, such as the supply voltage (e.g., VCC).

At least in certain applications, the characteristics of the load may vary markedly as a function of temperature (for example, owing to the variation of the resistance of the windings) with the additional need to take into account the variability of the characteristics of the load due to the tolerances of the manufacturing process.

If added to this are the possible variations (allowed, at least to a certain extent) of the supply voltage, it may be understood how in this solution the peak value may prove markedly variable.

In certain applications where it is desired not to exceed an (upper) limit value of the current, conservative criteria may be adopted in the choice of the integral reference value (INT_REF), staying at lower levels as compared to the theoretical levels that can be defined on the basis of the nominal parameters of load and supply voltage.

The choice of a low reference value has, however, the effect of reducing the performance of the system in so far as it reduces the signal-to-noise ratio of the measurements in conditions whereby, at least in certain applications, the advantages in terms of reduction of the effects of the electrical noise on the sensing element linked to the integration function are mitigated in an undesired way.

One or more embodiments aim at facilitating a choice of current value irrespective of the characteristics of the load and/or of the supply voltage.

One or more embodiments may use a circuit architecture that substantially resembles the one exemplified in FIG. 4, envisaging a sort of calibration made during application of one or more current pulses during or prior to the inductive-sense procedure proper.

One or more embodiments may consequently adopt a sort of mixed approach that may combine a current-peak control with an integral current control.

One or more embodiments may envisage recourse to different modalities of implementation.

For instance, in certain embodiments, the calibration procedure may be performed just once or else repeatedly during execution of the inductive-sense procedure. One or more embodiments may "work" on just one pulse or else on a number of pulses.

Figure 6:
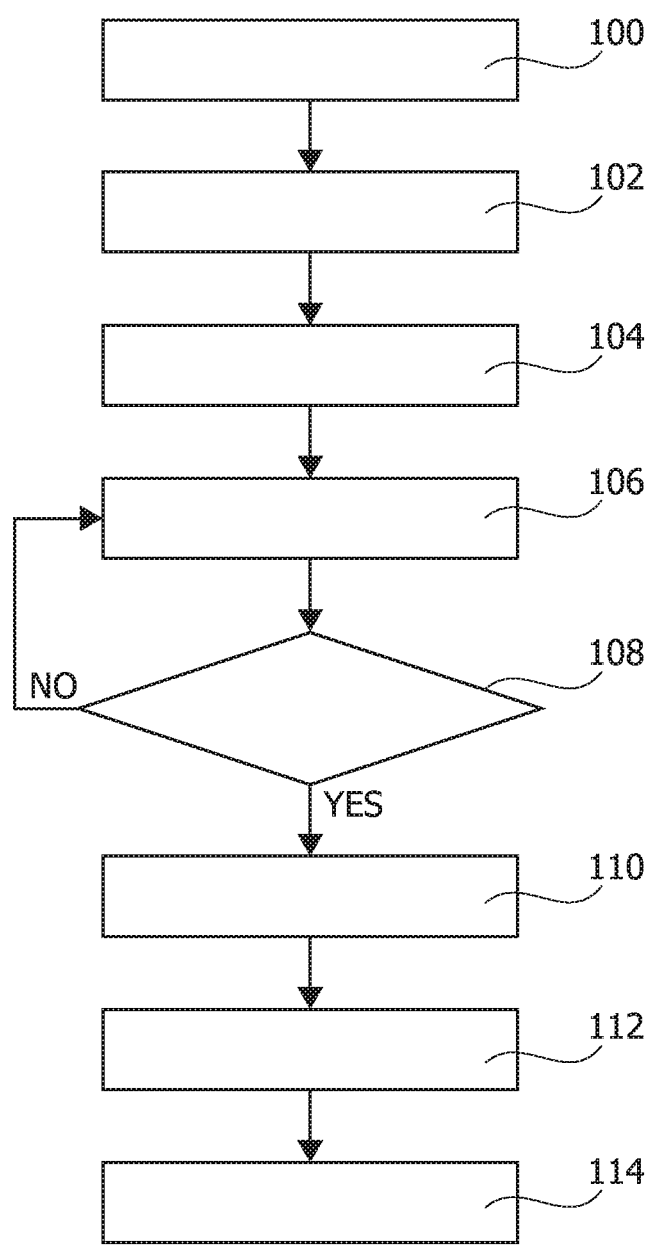
FIG. 6 is a flowchart provided by way of example of embodiments.
Figure 7:
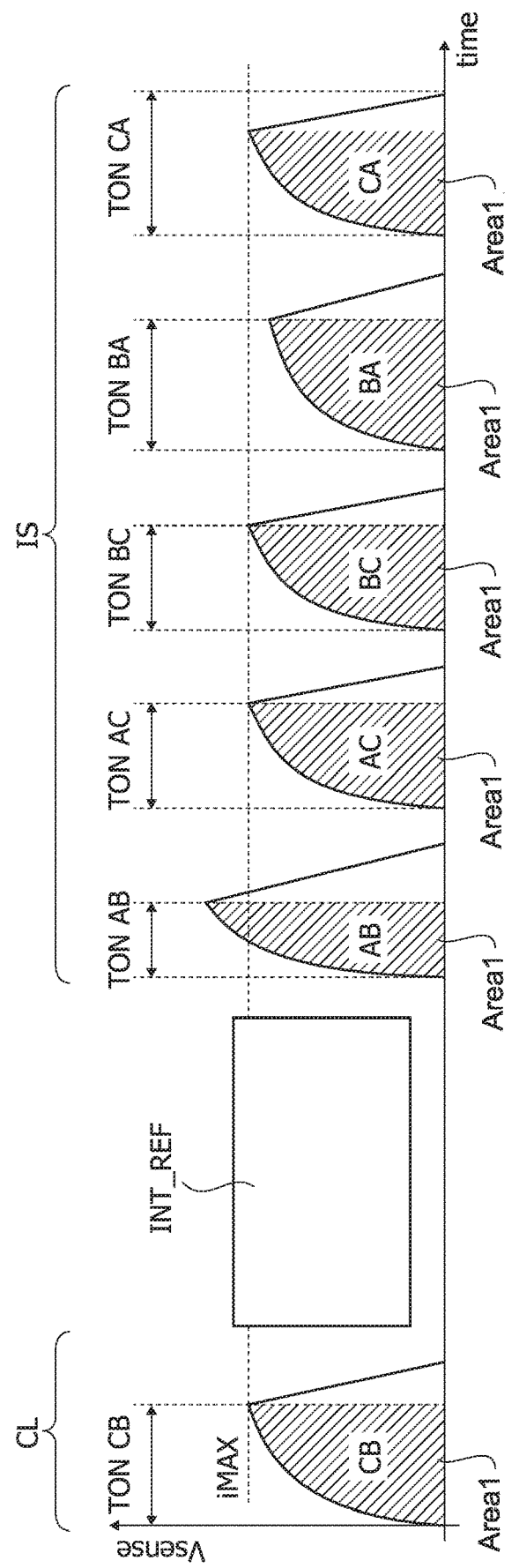
FIG. 7 illustrates a possible plot of signals in embodiments operating according to the flowchart of FIG. 6.

With reference to FIGS. 6 and 7, examples of embodiments in which the calibration is conducted on a single current pulse will now be described.

In one or more embodiments, as exemplified by the flowchart of FIG. 6 (which may be implemented, for example, at the level of the various blocks of the circuit CON exemplified in FIG. 4, hence without substantial modifications of the circuit itself), after a starting step 100, in a step 102 (of calibration, CL in FIG. 7) applied to the windings/phases A, B, C is just one (voltage) pulse, which results in a response (current) pulse, as exemplified by the pulse of Vsense furthest to the left in FIG. 7 (here indicated as corresponding, for example, to the pulse CB—this of course is just an example), to which the current-peak threshold technique is applied.

This pulse will have a current peak controlled "by definition" at a value iMax, with at most a minor variability dictated by the thermal noise present in the sensing element, which may, for example, be of the sigma-delta type (see, for example, U.S. Pat. No. 8,704,479).

Following upon starting of the temporal measurement of the pulse (step 104), which is to reach a predetermined peak value (iMax), in a step 106 an integral measurement of Vsense (corresponding to the current in the load) is made until the aforesaid peak value (iMax) is reached.

Reaching of the above condition is detected following upon the positive outcome Y from a step 108 of comparison of the value of the current with the threshold iMax, such as to lead to interruption of the temporal measurement (step 110) and to adoption (step 112) of the corresponding integral value as integral reference INT_REF (see the diagram of FIG. 4).

At the end of the current pulse used for calibration the following parameters will hence be known: current-peak value; and integral value of the current (area Area1) on the right in FIG. 7; and time for reaching the peak value of the current iMax (which is equal to the time for reaching the integral value Area1).

Once a calibration procedure designated as a whole by CL is thus through, the integral value measured during application of the calibration pulse (the one furthest to the left in FIG. 7) can be used as reference for an inductive-sense procedure (IS—block 114) conducted for example according to sigma-delta criteria as described, for instance, in U.S. Pat. No. 8,704,479, using, however, as reference INT_REF the integral value Area1 determined during the application of the calibration pulse, with the above integral value that may be used as integral reference for all the other pulses.

In some embodiments, microprocessor MP determines reference INT_REF.

Considering that the duration of each inductive-sense pulse is (much) shorter than the thermal time constants of the windings of the motor and considering the supply voltage as stable in the time interval for carrying out the entire inductive-sense procedure (IS), one or more embodiments as exemplified in FIGS. 6 and 7 are able to facilitate reaching of a desired current peak in a way irrespective of the characteristics of the load of the supply voltage.

A solution as exemplified in FIGS. 6 and 7 is thus able to combine the intrinsic immunity to noise linked to the operation of integration with the fact that the absorption of energy associated to the various measurement pulses (of which the calibration pulse, for example, the pulse CB on the left in FIG. 7, may represent the first), i.e., the areas Area1 in FIG. 7, does not exceed the energy absorption linked to the pulse that reaches the peak value iMax.

It has been noted that a solution as exemplified in FIGS. 6 and 7 does not in itself make it possible to control the absolute value of all the current peaks (e.g., AB, AC, BC, BA, CA in FIG. 7) in so far as the pulse used during calibration does not necessarily correspond to the phase that has the shortest time constant.

For instance, FIG. 7 refers (by way of example—it is emphasized) to a solution in which—even though an integral of a value equal to the area Area1 is used as reference—the second pulse of the sequence (AB, with duration TON AB) has a peak or crest portion that exceeds the value iMax.

One or more embodiments as exemplified in FIGS. 6 and 7 are hence suited to being used in situations where a certain variability of the current peak due to the saturations induced by the rotor may be tolerated.

A solution as exemplified in FIGS. 6 and 7 makes it possible to obtain that the first pulse of the inductive-sense procedure (for example, the one furthest to the left in FIG. 7) is controlled in amplitude, without, however, it being possible to know whether the current peaks associated to the other pulses (which care in general different) will be higher or lower than the calibration value iMax. It is in any case a solution that is able to compensate adequately the variability due to the supply voltage of the system, which may affect the variability of the current peak in solutions as the ones exemplified in U.S. Pat. No. 8,704,479.

As has already been said, one or more embodiments of this nature may be advantageously used in a wide range of possible solutions in which there are now particularly stringent limits as regards the maximum current value allowed. A situation of this kind may be dealt with by envisaging a slightly conservative choice of the value iMax on which to carry out the calibration procedure.

For instance, in situations where the current peak may be expected to present a variability of 10% on account of the different time constant linked to the different position of the rotor of the motor, it is possible to consider applying the calibration pulse (CB, in the example presented in FIG. 7) with reference to a current value reduced by 10% with respect to the maximum allowed/expected value.

The above solution may prove satisfactory, even though in certain conditions the overall performance of system may be slightly penalized by a behavior linked to the initial position of the rotor during application of the calibration pulse.

One or more embodiments may tackle these aspects with a "complete" characterization of the current pulses, thus facilitating the choice of an integral reference value according to criteria more sophisticated than the ones described previously.

One or more embodiments as exemplified in FIGS. 8 and 9 envisage performing a calibration step CL by applying the current-threshold technique to all the pulses (once again reference will be made to a hypothetical sequence CB, AB, AC, BC, BA, CA).

With reference, for example, to the flowchart of FIG. 8 (which also may be implemented, for example, at the level of the various blocks of the circuit CON exemplified in FIG. 4), after a starting step 200 and a step 202 of application of the first pulse, operations of calculation of the integral value conducted in steps 204 and 206 basically corresponding to the steps 106 and 108 described with reference to FIG. 6 are carried out on all the "other" pulses of the sequence (AB, AC, BC, BA, CA), storing, in a step 208, the respective integral values A1, A2, A3, A4, A5, A6 in a loop, with exit condition in a step 210, that reiterates from step 212. In this way, it is possible to detect and store, for all the pulses of the sequence, integral values calculated on time intervals referring to a peak value corresponding to iMax (which is not exceeded for any pulse).

In a step 214, it is hence possible to detect the lowest value out of the values A1, A2, A3, A4, A5, A6 detected on the various pulses (here the six pulses CB, AB, AC, BC, BA, CA), taking into account the fact that, at the moment when the threshold value iMax is reached, the integral value of the single pulse is also known.

The lowest value out of A1, A2, A3, A4, A5, A6, denoted as A MIN, may be adopted as integral reference threshold INT_REF for performing an inductive-sense procedure (IS), which once again may be of the type described in U.S. Pat. No. 8,704,479 and may be carried out in a step identified by the block 216 in FIG. 8 (see also the block 114 in FIG. 6).

Figure 8:
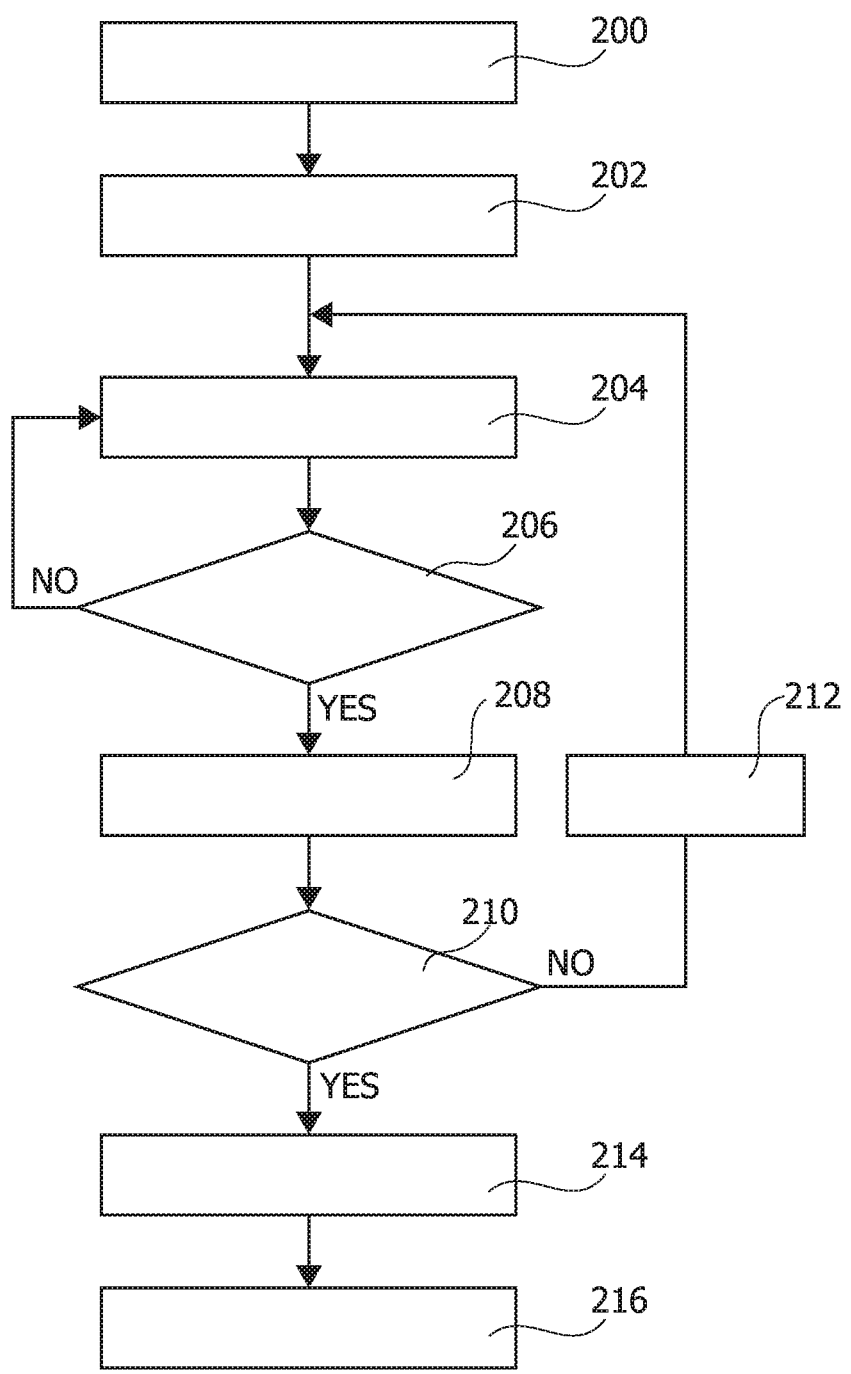
FIG. 8 is a flowchart provided by way of example of embodiments.

As may be noted, for example, in FIG. 10, the various pulses CB, AB, AC, BC, BA, CA during the calibration step CL have the same peak value iMax and values of integral (area) A1, A2, A3, A4, A5, A6 different from one another, with the possibility, in step 214 of FIG. 8, of identifying the lowest value out of the above values to be used as integral reference INT_REF.

The use of the minimum integral threshold calculated as described with reference, for example, to the flowchart of FIG. 8 makes it possible to obtain that the current peak of the pulses of the inductive-sense step (IS) (on the right in FIG. 10) will not exceed the value iMax that may be reached by the pulse (or pulses) of minimum duration, for example the pulse AB in the right-hand part of FIG. 10.

In this way, it is possible to obtain a sort of optimization of the current peak to the advantage of the signal/noise ratio of the individual measurements and of the precision of the entire inductive-sense procedure.

Figure 9:
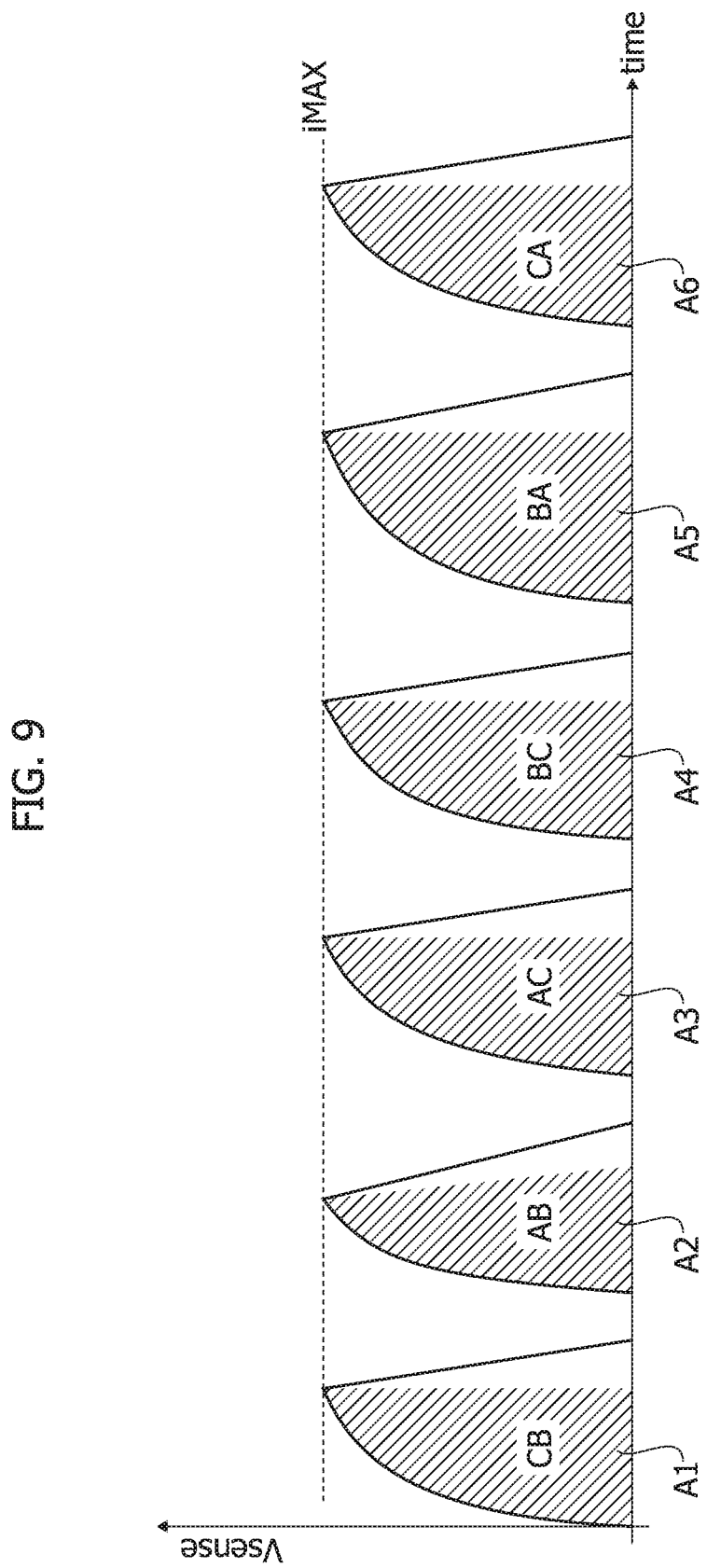
FIG. 9 illustrates a possible plot of signals in embodiments operating according to the flowchart of FIG. 8.

One or more embodiments, as exemplified in FIGS. 8 to 10, hence envisage two inductive-sense procedures in (rapid) succession: the former, with current threshold—on the left in FIG. 10—is dedicated to just the calibration CL; the latter, with minimum integral threshold—on the right in FIG. 10—is dedicated to the measurement IS of the position of the rotor proper.

One or more embodiments as exemplified in FIGS. 6 and 7 envisage, instead, that all the pulses applied may be used for the purposes of measurement in so far as the pulse generated in the calibration step CL (e.g., the pulse CB furthest to the left in FIG. 7) is used both for calibration and for measurement IS.

A method according to one or more embodiments may comprise: applying (e.g., MP; GLA, GHA, GLB, GHB, GLC, GHC) to windings (e.g., A, B, C) of an electric motor comprising a rotor (e.g., R) a time sequence of position-detection pulses (e.g., voltage pulses) and detecting (e.g., as voltage signal Vsense detected starting from current signals with an amperometric resistor Rsense) a corresponding time sequence of response signals (e.g., CB, AB, AC, BC, BA, CA); integrating (e.g., ID) the response signals in the sequence of response signals, and recording (e.g., RT) respective times (e.g., TON CB, TON AB, TON AC, TON BC, TON BA, TON CA) taken by the integrated response signals to reach an integral reference threshold (e.g., INT_REF); and detecting the position of the rotor of the motor as a function of the respective recorded times.

Such an inductive-sense procedure may be implemented, for example, according to the criteria exemplified in U.S. Pat. No. 8,704,479.

According to one or more embodiments, the aforesaid integral reference threshold may be established by: setting a peak value (e.g., iMax) of response signal (hence corresponding, for example, to a peak value of the current in the windings); applying to the windings of the motor at least one calibration pulse; detecting at least one response signal in response to the at least one calibration pulse; integrating the at least one response signal in response to the at least one calibration pulse over the time taken by the at least one response signal in response to the at least one calibration pulse to reach the peak value; and selecting, as the integral reference threshold, an integral (e.g., Area1 in FIG. 7 or A MIN in FIG. 10) of the at least one response signal in response to the at least one calibration pulse integrated over the time taken to reach the peak value.

One or more embodiments (see, for example, FIGS. 6 and 7) may use as calibration pulse one of the pulses (e.g., the first) in the time sequence of position-detection pulses, selecting, as integral reference threshold, the integral (Area1) of the respective response signal (e.g., the first, i.e., for example, CB in FIG. 7) in the time sequence of response signals integrated over the respective time (e.g., TON CB) taken to reach the peak value.

One or more embodiments may comprise: fixing an upper limit value of the response signal (hence of the current in the windings of the motor); and setting the peak value (e.g., iMax) at a value lower (e.g., by a certain safety percentage) than the upper limit value.

One or more embodiments (see, for example, FIGS. 8 to 10) may comprise: applying to the windings a time sequence of calibration pulses to detecting a corresponding time sequence of calibration response signals (CL, in FIG. 10); integrating the calibration response signals in the sequence of calibration response signals, where the calibration response signals in the sequence of calibration response signals take respective times to reach the peak value; detecting the integrals (A1, A2, A3, A4, A5, A6) of the calibration response signals in the sequence of calibration response signals over the respective times to reach the peak value; and selecting as the integral reference threshold the lowest value (A MIN) out of the integrals (A1, A2, A3, A4, A5, A6) of the calibration response signals in the sequence of calibration response signals integrated over the respective times to reach the peak value.

A system for implementing a method according to one or more embodiments may comprise: a drive circuit (e.g., MP) configured for applying to windings of an electric motor comprising a rotor a time sequence of position-detection-pulse signals (e.g., voltage signals) and detecting a corresponding time sequence of response signals (e.g., current signals, detected as voltage signal Vsense); and a detector circuit (e.g., C) configured for integrating the response signals in the sequence of response signals, recording respective times taken by the integrated response signals to reach the integral reference threshold selected as integral (Area1, A MIN) of the at least one response signal in response to the at least one calibration pulse integrated over the time taken to reach the peak value and supplying to the drive circuit a signal that is a function of the respective times recorded and is indicative of the position of the rotor of the motor.

One or more embodiments may comprise an electric motor (e.g., M), including a set of windings (e.g., A, B, C) and a rotor (e.g., R), the electric motor being equipped with a system according to one or more embodiments.

A motor according to one or more embodiments may comprise a brushless motor of a sensor-less type. In some embodiments, the motor, such as a BLDC motor, includes within the motor's package the control circuit (e.g., CON), and/or the half-bridges (e.g., HA, HB, HC).

Without prejudice to the underlying principles, the details of construction and the embodiments may vary, even significantly, with respect to what has been illustrated herein purely by way of non-limiting example, without thereby departing from the extent of protection.

The extent of protection is determined by the annexed claims.

What is claimed is:

1. A method comprising:
    applying a time sequence of position-detection pulses to windings of an electric motor that comprises a rotor;
    detecting a corresponding time sequence of response signals;
    integrating the response signals in the corresponding time sequence of response signals;
    recording respective times taken by the response signals to reach an integral reference threshold;
    detecting a position of the rotor of the electric motor as a function of the respective times recorded; and
    establishing the integral reference threshold by:
        setting a peak value;
        applying a calibration pulse to the windings of the electric motor;
        detecting a calibration response signal in response to the calibration pulse;
        integrating the calibration response signal over a time taken by the calibration response signal to reach the peak value to generate an integral calibration value; and
        selecting the integral reference threshold based on the integral calibration value.

2. The method of claim 1, wherein the calibration pulse is a pulse of the time sequence of position-detection pulses, and wherein the integral reference threshold is the integral calibration value.

3. The method of claim 2, wherein the calibration pulse is a first pulse in the time sequence of position-detection pulses.

4. The method of claim 2, further comprising fixing an upper limit value of the calibration response signal, and wherein setting the peak value comprises setting the peak value at a value lower than the upper limit value.

5. The method of claim 1, further comprising:
    applying to the windings a time sequence of calibration pulses and detecting a corresponding time sequence of calibration response signals, wherein the time sequence of calibration pulses comprises the calibration pulse;
    integrating the calibration response signals in the corresponding time sequence of calibration response signals, wherein the calibration response signals in the time sequence of calibration response signals take respective times to reach the peak value;
    determining calibration integrals of the calibration response signals over the respective times taken to reach the peak value; and
    selecting as the integral reference threshold a lowest value out of the calibration integrals.

6. The method of claim 1, wherein the electric motor is a brushless DC (BLDC) motor, and wherein applying the time sequence of position-detection pulses comprises using a plurality of half-bridges.

7. A system comprising:
    a drive circuit configured to:
        apply a time sequence of position-detection pulse signals to windings of an electric motor comprising a rotor, and
        detect a corresponding time sequence of response signals;
    a detector circuit configured to:
        integrate the response signals in the corresponding time sequence of response signals,
        record respective times taken by the response signals to reach an integral reference threshold, and
        supply to the drive circuit a signal that is a function of the respective times recorded and is indicative of a position of the rotor of the electric motor, wherein the system is configured to establish the integral reference threshold by:
            setting a peak value;
            applying to the windings of the electric motor a calibration pulse;
            detecting a calibration response signal in response to the calibration pulse;
            integrating the calibration response signal over a time taken by the calibration response signal to reach the peak value to generate an integral calibration value; and
            selecting the integral reference threshold based on the integral calibration value.

8. The system of claim 7, wherein the calibration pulse is a pulse of the time sequence of position-detection pulses, and wherein the integral reference threshold is the integral calibration value.

9. The system of claim 8, wherein the calibration pulse is a first pulse in the time sequence of position-detection pulses.

10. The system of claim 8, wherein the system is further configured to fix an upper limit value of the calibration response signal, and wherein the system is configured to set the peak value at a value lower than the upper limit value.

11. The system of claim 7, wherein the system is further configured to:
    apply to the windings a time sequence of calibration pulses and detect a corresponding time sequence of calibration response signals, wherein the time sequence of calibration pulses comprises the calibration pulse;
    integrate the calibration response signals in the corresponding time sequence of calibration response signals, wherein the calibration response signals in the time sequence of calibration response signals take respective times to reach the peak value;

determine calibration integrals of the calibration response signals over the respective times taken to reach the peak value; and select as the integral reference threshold a lowest value out of the calibration integrals.

12. The system of claim 7, further comprising the electric motor.

13. The system of claim 7, wherein the drive circuit comprises an output stage that comprises a plurality of half-bridges configured to be coupled to the windings of the electric motor.

14. The system of claim 7, wherein the drive circuit comprises a microcontroller.

15. The system of claim 7, further comprising a sense resistor configured to be coupled to the windings, wherein the detector circuit comprises an analog-to-digital converter coupled to the sense resistor and to an integrator configured to integrate the response signals.

16. An electric motor comprising:
a set of windings;
a rotor;
a drive circuit configured to:
  apply a time sequence of position-detection pulse signals to the set of windings, and
  detect a corresponding time sequence of response signals;
a detector circuit configured to:
  integrate the response signals in the corresponding time sequence of response signals,
  record respective times taken by the response signals to reach an integral reference threshold, and
  supply to the drive circuit a signal that is a function of the respective times recorded and is indicative of a position of the rotor,
wherein the drive circuit is configured to establish the integral reference threshold by:
  setting a peak value;
  applying to the set of windings a calibration pulse;
  detecting a calibration response signal in response to the calibration pulse;
  integrating the calibration response signal over a time taken by the calibration response signal to reach the peak value to generate an integral calibration value; and
  selecting the integral reference threshold based on the integral calibration value.

17. The electric motor of claim 16, wherein the calibration pulse is a pulse of the time sequence of position-detection pulses, and wherein the integral reference threshold is the integral calibration value.

18. The electric motor of claim 17, wherein the drive circuit is further configured to fix an upper limit value of the calibration response signal, and wherein the drive circuit is configured to set the peak value at a value lower than the upper limit value.

19. The electric motor of claim 16, wherein the drive circuit is further configured to:
apply to the set of windings a time sequence of calibration pulses and detect a corresponding time sequence of calibration response signals, wherein the time sequence of calibration pulses comprises the calibration pulse;
integrate the calibration response signals in the corresponding time sequence of calibration response signals, wherein the calibration response signals in the corresponding time sequence of calibration response signals take respective times to reach the peak value;
determine calibration integrals of the calibration response signals over the respective times taken to reach the peak value; and
select as the integral reference threshold a lowest value out of the calibration integrals.

20. The electric motor of claim 16, wherein the electric motor is a brushless DC motor (BLDC).

* * * * *